United States Patent [19]

Birch et al.

[11] Patent Number: 4,578,599
[45] Date of Patent: Mar. 25, 1986

[54] FLIP-FLOP HAVING IMPROVED SYNCHRONOUS RESET

[75] Inventors: William A. Birch, Tempe; Lillie M. Woodard, Chandler, both of Ariz.

[73] Assignee: Motorola, Inc., Schaumburg, Ill.

[21] Appl. No.: 500,594

[22] Filed: Jun. 2, 1983

[51] Int. Cl.[4] ............................................. H03K 3/289
[52] U.S. Cl. ................................ 307/272 A; 307/291; 307/299 A
[58] Field of Search ................... 307/272 A, 289, 291, 307/299 A; 328/206

[56] References Cited

U.S. PATENT DOCUMENTS

| | | | |
|---|---|---|---|
| 3,622,803 | 11/1971 | Cooper et al. | 307/247 |
| 4,289,979 | 9/1981 | Muller | 307/272 A |
| 4,349,753 | 9/1982 | Scavuzzo | 307/289 X |
| 4,491,745 | 1/1985 | Birch | 307/272 A |
| 4,506,165 | 3/1985 | Gulati et al. | 307/272 A |
| 4,517,475 | 5/1985 | Petty | 307/272 A |

OTHER PUBLICATIONS

Wu, W. W. Master-Slave Flip-Flop, IBM Technical Disclosure Bulletin, vol. 16, No. 7, Dec. 1973, pp. 2131-2132.

Primary Examiner—Stanley D. Miller
Assistant Examiner—David R. Bertelson
Attorney, Agent, or Firm—William E. Koch

[57] ABSTRACT

A flip-flop is provided having a data gate circuit for receiving input data and generating therefrom first and second complementary internal data signals representative of the input data. A master circuit is coupled to the data gate circuit for receiving a clock pulse and for latching the internal data signals during a predetermined portion of the clock pulse. A slave circuit is coupled to the master circuit for storing the internal data signals. A reset circuit supplies a synchronous reset signal to the master circuit for resetting the first and second complementary internal data signals on the occurrence of the next clock pulse.

7 Claims, 1 Drawing Figure

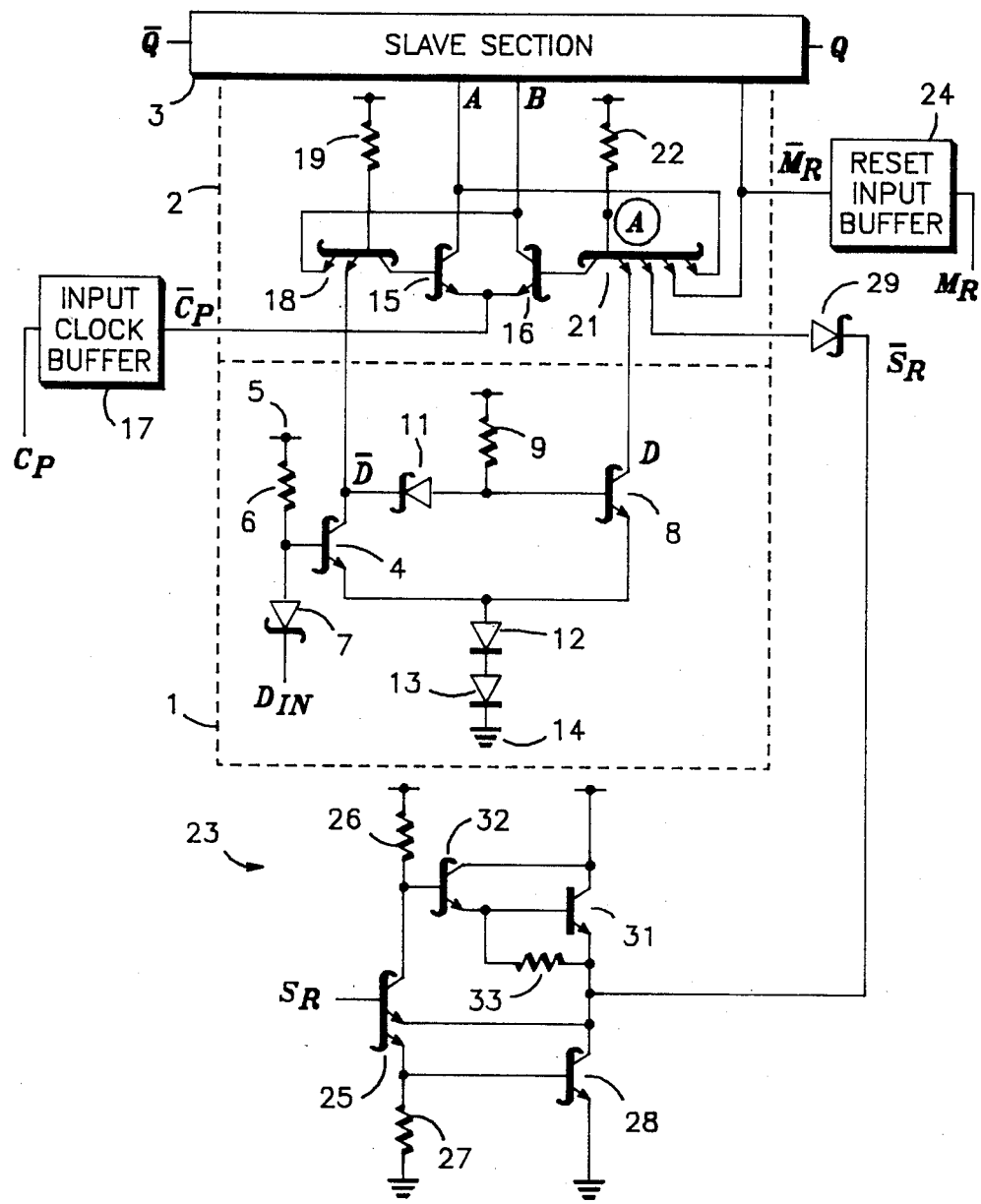

FLIP-FLOP HAVING IMPROVED SYNCHRONOUS RESET

BACKGROUND OF THE INVENTION

1. Field of the Invention

This invention relates generally to flip-flops having a synchronous reset and, more particularly, to a flip-flop having synchronous reset circuitry connected directly to the master section of the flip-flop, thereby bypassing load, enable and data gate circuitry.

2. Background Art

One type of previously known flip-flops comprise a data gate having a data input for generating internal data signals, a master section for receiving a clock signal and responsive to the internal data signals and for generating first and second signals indicative of the data input, and a slave section responsive to the first and second signals for storage therein and for generating traditional Q and $\overline{Q}$ outputs.

The data gate of this previously known flip-flop comprises a first transistor having a collector coupled to the master section and a base coupled to a first reference voltage by a first resistor and to the anode of a buffer diode. The cathode of the buffer diode is coupled to the data input. A second transistor has a collector connected to the master section and a base connected to the first reference voltage by a second resistor and to the anode of a diode. The cathode of this diode is coupled to the collector of the first transistor. The emitter of both the first and second transistors are connected together and coupled to the anode of one or more level setting diodes coupled in series. The cathode of the last diode in series is coupled to a second reference voltage. A synchronous reset signal is applied through a buffer circuit or load or enable gate circuit to the cathode of a Schottky diode. The anode of the Schottky diode is connected to the base of the first transistor. When the reset signal transitions low, the first transistor is biased off and the second transistor is biased on, causing the internal data signal to go low, regardless of the data input. Output Q would assume the low voltage level on the next triggering clock pulse.

However, this previously known circuitry has a relatively large set up and recovery time since the reset signal must pass through the load, enable, and data gate circuitry. Setup time is the minimum time required for the correct logic level to be present at the logic input prior to the clock transition from low to high in order to be recognized and transferred to the outputs. Recovery time is the minimum time required between the end of the reset pulse and the clock transition from low to high in order to recognize and transfer high data to the Q outputs. Furthermore, the previously known circuitry has a larger input load and requires a higher current for the reset signal since it is routed through the load and enable gate circuits.

Therefore, what is needed is a flip-flop having an improved synchronous reset that reduces setup and recovery time, reduces supply current, simplifies layout by reducing component count, and reduces input load.

SUMMARY OF THE INVENTION

Accordingly, it is an object of the present invention to provide a flip-flop having an improved synchronous reset.

Another object of the present invention is to provide a flip-flop having reduced setup time.

A further object of the present invention is to provide a flip-flop having reduced recovery time.

Still another object of the present invention is to provide a flip-flop having reduced supply current.

Yet another object of the present invention is to provide a flip-flop having a simplified layout with reduced component count.

Another object of the present invention is to provide a flip-flop having a reduced input load.

In carrying out the above and other objects of the invention in one form, there is provided an improved flip-flop having a data gate circuit for receiving input data and for generating first and second complementary internal data signals representative of the input data. A master circuit is coupled to the data gate and receives a clock signal for latching the internal data signals during a predetermined portion of the clock signal. A slave circuit is coupled to the master circuit for storing the internal data signals and a reset circuit is coupled to the master circuit for resetting the first and second complementary internal data signals on the occurrence of the next triggering clock pulse.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the present invention.

DETAILED DESCRIPTION OF THE DRAWING

Referring to the single FIGURE, the preferred embodiment of the flip-flop having an improved synchronized reset includes data gate 1, master section 2, and slave section 3. Data gate 1 comprises Schottky transistor 4 having a base both coupled to reference voltage terminal 5 by resistor 6 and connected to the anode of Schottky diode 7. The cathode of Schottky diode 7 is adapted to receive data input signal $D_{IN}$. Schottky transistor 8 has a base coupled to reference voltage terminal 5 by resistor 9 and is connected to the anode of Schottky diode 11. The cathode of Schottky diode 11 is connected to the collector of Schottky transistor 4. The emitter of Schottky transistors 4, 8 are connected together and to the anode of level setting diode 12. Level setting diode 13 has its anode connected to the cathode of diode 12 and its cathode connected to reference voltage terminal 14. The voltage level on reference voltage terminals 5 and 14, for example, may be five volts and zero volts, respectively. When a data input $D_{IN}$ transitions to a logical high ("1") transistor 4 is biased on, causing its collector to go to a logical low ("0") and transistor 8 to be biased off. The voltage levels for a logical high and a logical low, for example, may be 3.0 volts and 0.0 volts, respectively. The collector of transistor 8 is therefore a "1". The levels of voltages on the collectors of transistors 4, 8 represent internal data signals $\overline{D}$ and D, respectively, and are provided to master section 2 as described hereinafter. Master section 2 includes differentially connected Schottky transistors 15, 16 having their emitters connected together and to an input clock buffer 17 for receiving inverted clock pulse $\overline{C}_P$. A clock pulse $C_P$ is applied as an input to input clock buffer 17. Input clock buffer 17 is a typical inverting input buffer known to those skilled in the art for reducing "Fan Out" of the clock pulse $C_P$.

The base of Schottky transistor 15 is connected to the collector of multi-emitter Schottky transistor 18. Transistor 18 has its base coupled to reference voltage terminal 5 by resistor 19, a first emitter connected to the collector of Schottky transistor 4 and responsive to internal data signal $\overline{D}$, and a second emitter connected to the collector of Schottky transistor 16. The base of Schottky transistor 16 is connected to the collector of multi-emitter Schottky transistor 21. Schottky transistor 21 has its base coupled to reference voltage terminal 5 by resistor 22, one emitter connected to the collector of Schottky transistor 8 and responsive to internal data signal D, a second emitter coupled to synchronous reset circuitry 23, a third emitter connected to both master reset input buffer 24 and to slave section 3, and a fourth emitter connected to the collector of Schottky transistor 15. The collectors of Schottky transistors 15, 16 are connected to slave section 3 and supply signals A and B, respectively, thereto. Master reset input buffer 24 is a typical inverting input buffer known to those skilled in the art for reducing "fan out" of the master reset signal $M_R$.

When internal data signal $\overline{D}$ is a "0", current is taken from the base of Schottky transistor 15, causing its collector to become a "1". If master reset signal $\overline{M_R}$ from master reset input buffer 24 and synchronous reset signal $\overline{S_R}$ from synchronous reset circuitry are both a "1", and since internal data signal D is a "1", Schottky transistor 16 will be biased on causing its collector to become a "0". Therefore, signals A and B are "1" and "0", respectively, and are supplied to slave section 3, causing outputs Q and $\overline{Q}$ to be "1" and "0", respectively. Slave section 3 is typical of many flip-flops known to those skilled in the art and is represented in block diagram form.

Synchronous reset circuitry 23 includes an input buffer comprising multi-emitter Schottky transistor 25 having a base responsive to synchronous reset signal SR and a collector coupled to reference voltage terminal 5 by resistor 26. Schottky transistor 25 has one emitter both coupled to reference voltage terminal 14 by resistor 27 and connected to the base of Schottky transistor 28, and a second emitter connected to the collector of Schottky transistor 28. Schottky transistor 28 has its emitter connected to reference voltage terminal 14 and its collector connected to the cathode of Schottky diode 29. The anode of Schottky diode 29 is connected to the second emitter of Schottky transistor 21. Transistor 31 has its emitter connected to the collector of Schottky transistor 28 and coupled to its own base and the emitter of Schottky transistor 32 by resistor 33. The collector of transistor 31 is connected to reference voltage terminal 5 and to the collector of Schottky transistor 32. A synchronous reset signal $S_R$ of "1" will bias Schottky transistor 25 on causing Schottky transistor 28 to be biased on and pulling synchronous reset signal $\overline{S_R}$ to a "0".

To illustrate how the synchronous reset functions and the advantages of the improved flip-flop described herein, it will be necessary to describe voltage levels appearing at various points in the circuit under certain conditions of $D_{IN}$ and $C_P$. The voltage appearing across a PN diode or base-emitter of a standard transistor will be referred to as $V_{BE}$ (approximately 0.75 volts). The voltage across a Schottky diode or base-collector of a Schottky transistor will be referred to as $V_{SCH}$ (approximately 0.50 volts) and the voltage across the collector-emitter of a Schottky transistor in the active region will be referred to as $V_{SAT}$ (approximately 0.25 volts).

Assume first that output Q is a "1", output is a "0" clock pulse CP is a "0" and data input $D_{IN}$ is a "1". Since input clock buffer 17 inverts clock pulse $\overline{C_P}$, clock pulse $\overline{C_P}$ is a "1". Furthermore, the input clock buffer 17 is designed so that a clock pulse CP of "0" has a voltage level of $V_{SAT}$. Since data input $D_{IN}$ is a "1", internal data signal $\overline{D}$ has a voltage level of $2V_{BE}+V_{SAT}$ due to diodes 12, 13 and Schottky transistor 4. Since internal data signal $\overline{D}$ is a "0", Schottky transistor 8 is off and internal data signal D is a "1". Synchronous reset signal SR is a "1", turning on Schottky transistors 25, 28. Thus, synchronous reset $\overline{S_R}$ is a "0". Schottky transistor 28 is clamped out of saturation by connecting one emitter of Schottky transistor 25 to the collector of Schottky transistor 28 (referred to as a Baker clamp) causing the voltage level at the collector of Schottky transistor 28 to be a $V_{BE}$. Therefore, the voltage level of the second emitter of Schottky transistor 21 is $V_{BE}+V_{SCH}$ due to Schottky diode 29 and Baker clamped Schottky transistor 28. Since clock pulse $\overline{C_P}$ is a "1", both Schottky transistors 15, 16 are off and both signals A and B are a "1" due to circuitry within slave section 3. When $C_P$ becomes a "1" and $\overline{C_P}$ becomes a "0", and as the voltage of $\overline{C_P}$ drops, one of Schottky transistors 15, 16 will turn on first. Since the base of Schottky transistor 15 is at $3V_{BE}+V_{SAT}$ or 2.50 volts ($\overline{D}$+base-emitter of Schottky transistor 18) and the base of Schottky transistor 16 is at $2V_{BE}+V_{SCH}$ or 2.00 volts, Schottky transistor 15 will turn on first, even though $\overline{D}$ is a "0". Therefore, signal A will become a "0" causing the base of Schottky transistor 16 to be a "0", therefore signal B will remain a "1". These values for signals A and B will cause Q and $\overline{Q}$ to become a "0" and a "1" respectively, in a manner known to those skilled in the art.

When a "1" is applied as master reset signal $M_R$ to master reset buffer 24, master reset signal $\overline{M_R}$ is applied to the third emitter of Schottky transistor 21. The master reset buffer 24 is designed so that master reset signal $\overline{M_R}$ has a "0" voltage level of $V_{SAT}$. When this occurs, the base of Schottky transistor 16 will have a voltage level of $V_{SAT}+V_{BE}$, or 1.0 volts ($\overline{M_R}$+base-emitter of Schottky transistor 21). Since the voltage level of master reset signal $M_R$ is below the voltage levels of the clock pulse $\overline{C_P}$, synchronous reset signal $\overline{S_R}$, and internal data signal $\overline{D}$, the master reset signal will asynchronously reset the flip-flop regardless of other inputs. The master reset signal is supplied to slave section 3 for resetting outputs Q and $\overline{Q}$ when the master section is latched.

The circuit shown is the preferred embodiment. However, there are a multitude of other ways of connecting a synchronous reset signal $\overline{S_R}$ within the master section to accomplish the same results. For example, by changing the voltage levels at the bases of Schottky transistors 15, 16, synchronous reset signal $S_R$ may be connected directly to the base of Schottky transistor 16.

By now it should be appreciated that there has been provided a flip-flop having an improved synchronous reset having reduced set up and recovery time, a reduced supply current requirement, a simplified layout with reduced component count, and a reduced input load on the synchronous reset.

We claim:
1. A flip-flop comprising:
   data gate circuit means for receiving input data and for generating therefrom first and second comple- mentary internal data signals representative of said input data;

master circuit means coupled for receiving a plurality of clock pulses in series and coupled to said data gate circuit means for latching said first and second complementary internal data signals during a predetermined portion of one of said clock pulses;

slave circuit means coupled to said master circuit means for storing said latched first and second complementary internal data signals; and reset means coupled to said master circuit means for resetting said latched first and second complementary internal data signals on the occurrence of the next of one of said clock pulses, said reset means including a reset signal having a voltage level greater than said clock pulse, but less than said input data.

2. The flip-flop according to claim 1 wherein said master circuit means comprises:

a pair of differentially connected transistors having their emitters coupled together and connectable to receive said clock pulse; and a first multi-emitter transistor having its collector coupled to the base of a first of said pair of differentially connected transistors, a first emitter coupled to said data gate circuit means and responsive to said first complementary internal data signal, a second emitter coupled to said reset means and responsive to said reset signal.

3. The flip-flop according to claim 2 wherein said data gate circuit comprises:

a first transistor having a base connectable to receive said input data; and a second transistor having a base coupled to a collector of said first transistor, a collector coupled to said first emitter of said first multi-emitter transistor.

4. The flip-flop according to claim 3 wherein said master circuit means further comprises:

a second multi-emitter transistor having a collector coupled to the base of a second of said pair of differentially connected transistors, a first emitter coupled to a collector of said first transistor, a second emitter coupled to the collector of said first of said pair of differentially connected transistors, said first multi-emitter transistor having a third emitter coupled to the collector of said second of said pair of differentially connected transistors.

5. The flip-flop according to claim 4 wherein said first multi-emitter transistor further comprises a fourth emitter connectable to receive a master reset signal having a voltage level less than the voltage levels of said clock pulse, said reset signal, and said input data.

6. A flip-flop having a data gate circuit means for receiving input data and for generating therefrom first and second complementary internal data signals representative of said input data, master circuit means for latching said first and second complementary internal data signals and coupled for receiving a clock pulse including a pair of differentially connected transistors having their emitters coupled together and coupled to receive said clock pulse and a first multi-emitter transistor having its collector coupled to the base of one of said pair of differentially connected transistors and a first emitter coupled to said data gate circuit and responsive to said first complementary internal data signal and a second emitter, slave circuit means coupled to said master circuit means for storing said latched first and second complementary internal data signals, the improvement comprising a synchronous reset means coupled to said second emitter for resetting said latched first and second complementary internal data signals on the occurrence of the next clock pulse.

7. The flip-flop according to claim 6 wherein said synchronous reset means includes a reset signal having a voltage level greater than said clock pulse and less than said input data.

* * * * *